United States Patent
Ott et al.

(10) Patent No.: US 7,833,472 B2
(45) Date of Patent: Nov. 16, 2010

(54) ARTICLE PREPARED BY DEPOSITING AN ALLOYING ELEMENT ON POWDER PARTICLES, AND MAKING THE ARTICLE FROM THE PARTICLES

(75) Inventors: Eric Allen Ott, Cincinnati, OH (US); Andrew Philip Woodfield, Cincinnati, OH (US); David Paul Mourer, Beverly, MA (US); John Frederick Ackerman, Laramie, WY (US); Jon Raymond Groh, Loveland, OH (US); Robert Edward Schafrik, Cincinnati, OH (US); Kenneth Rees Bain, Loveland, OH (US); Michael Francis Xavier Gigliotti, Scotia, NY (US); Matthew Bernard Buczek, Hamilton, OH (US)

(73) Assignee: General Electric Company, Schenectady, NY (US)

(*) Notice: Subject to any disclaimer, the term of this patent is extended or adjusted under 35 U.S.C. 154(b) by 645 days.

(21) Appl. No.: 11/142,786

(22) Filed: Jun. 1, 2005

(65) Prior Publication Data
US 2006/0275167 A1 Dec. 7, 2006

(51) Int. Cl.
B22F 1/00 (2006.01)
B22F 1/02 (2006.01)
(52) U.S. Cl. .............. 419/34; 419/63; 419/66
(58) Field of Classification Search ............ 419/23, 419/34, 46, 63, 66; 75/0.5 B; 72/254
See application file for complete search history.

(56) References Cited

U.S. PATENT DOCUMENTS

| | | | |
|---|---|---|---|
| 2,799,570 A | 7/1957 | Reed et al. | |
| 2,828,199 A | 3/1958 | Findlay | |
| 3,449,115 A | 6/1969 | Galmiche et al. | |
| 4,373,947 A | 2/1983 | Buttner et al. | |
| 4,381,942 A * | 5/1983 | Blum et al. | 419/23 |

(Continued)

FOREIGN PATENT DOCUMENTS

GB    EP0652299 A1    5/1995

(Continued)

OTHER PUBLICATIONS

Wu Ming-Fang, Yu Chun, Yu Zhi-Shui, Li Rui-Feng; Formation Process of Liquid in Interface of Ti/Cu Contact Reaction Couple; Trans. Nonferrous Met. Soc. China vol. 15 No. 1 Article ID: 1003-6326 (2005) 01-0125-05; Feb. 2005.

(Continued)

*Primary Examiner*—George Wyszomierski
*Assistant Examiner*—Weiping Zhu
(74) *Attorney, Agent, or Firm*—McNees Wallace & Nurick, LLC

(57) ABSTRACT

An article is prepared by furnishing a plurality of powder particle substrates made of a substrate metal, providing a nonmetallic precursor of a metallic coating material, wherein the metallic coating material comprises an alloying element that is thermophysically melt incompatible with the substrate metal, contacting the powder particle substrates with the nonmetallic precursor, chemically reducing the nonmetallic precursor to form coated powder particles comprising the powder particle substrates having a surface-enriched layer of the metallic coating material thereon without melting the powder particle substrates, and processing the coated powder particles to form the article, without melting the powder particle substrates.

22 Claims, 4 Drawing Sheets

U.S. PATENT DOCUMENTS

| | | | |
|---|---|---|---|
| 4,452,830 A | 6/1984 | Yoshizumi | |
| 4,525,206 A | 6/1985 | Soled et al. | |
| 4,687,632 A | 8/1987 | Hurd et al. | |
| 4,820,339 A | 4/1989 | Bienvenu et al. | |
| 4,860,567 A * | 8/1989 | Askey et al. | 72/254 |
| 4,892,579 A * | 1/1990 | Hazelton | 419/46 |
| 4,894,086 A | 1/1990 | Heuther et al. | |
| 4,975,333 A | 12/1990 | Johnson et al. | |
| 5,032,176 A | 7/1991 | Kametani et al. | |
| 5,240,742 A | 8/1993 | Johnson et al. | |
| 5,322,666 A | 6/1994 | Watwe | |
| 5,372,629 A | 12/1994 | Anderson et al. | |
| 5,470,401 A | 11/1995 | McCallum et al. | |
| 5,779,761 A | 7/1998 | Armstrong et al. | |
| 5,911,865 A | 6/1999 | Yih | |
| 5,930,580 A | 7/1999 | Everett | |
| 5,958,106 A | 9/1999 | Armstrong et al. | |
| 6,010,610 A | 1/2000 | Yih | |
| 6,540,811 B2 | 4/2003 | Hosoe et al. | |
| 6,582,651 B1 | 6/2003 | Cochran, Jr. et al. | |
| 6,737,017 B2 | 5/2004 | Woodfield et al. | |
| 6,811,881 B1 | 11/2004 | Clough | |
| 6,849,229 B2 | 2/2005 | Ott et al. | |
| 2003/0039860 A1 | 2/2003 | Cheon et al. | |
| 2004/0118245 A1 | 6/2004 | Ott et al. | |
| 2004/0159185 A1 | 8/2004 | Shamblen et al. | |
| 2004/0208773 A1 | 10/2004 | Woodfield | |

FOREIGN PATENT DOCUMENTS

| | | | |
|---|---|---|---|
| JP | 2002339006 A | * | 11/2002 |
| JP | 2004027242 A | * | 1/2004 |
| WO | WO 9964638 | | 12/1999 |

OTHER PUBLICATIONS

Vahlas C., et al., "Fluidization, Spouting, and Metal-Organic CVD of Platinum Group Metals on Powders", Chemical Vapor Deposition, vol. 8, No. 4, Jul. 2002, pp. 127-144, XP001122587, Wiley-VCH Verlag GmbH, D-69469, Weinheim, DE.

Doyle, Eoghan T. M. et al: "Carbothermic reduction of nickel-cobalt-chromium oxide mixture for the production of NiCoCr superalloy powder" EPD Congr. 1992, Proc. Symp. TMS Annu. Meet., 745-58. Editor(s): Hager, John P. Publisher: Miner. Met. Mater. Soc., Warrendale, PA. CODEN: 58HHA7, 1992, XP0009029023.

Okabe, T.H.: "Electrochemical Deoxidation of Titanium" Metallurgical Transactions B, vol. 24B, Jun. 1993, pp. 449-455, XP000381332 cited in the application abstract; figures 1,3; table 1 par. I Introduction, paragraphs 1, 2, 5; par. II Principle: par. III, A Experimental, Starting materials; par. V, A Discussion, Deoxidation Reaction, paragraph 3.

* cited by examiner

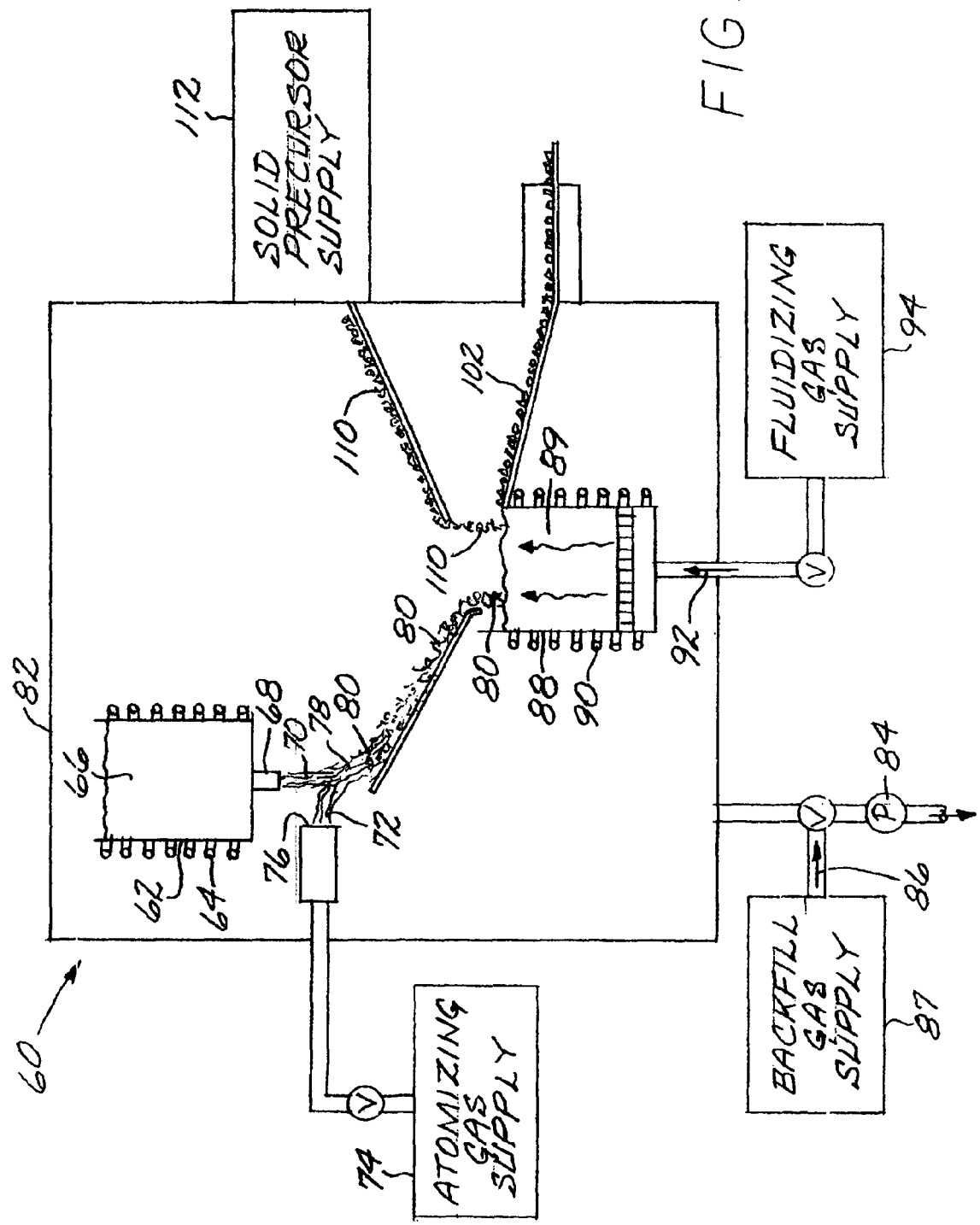

ARTICLE PREPARED BY DEPOSITING AN ALLOYING ELEMENT ON POWDER PARTICLES, AND MAKING THE ARTICLE FROM THE PARTICLES

This invention relates to the fabrication of an article by a powder metallurgical approach.

BACKGROUND OF THE INVENTION

Powder metallurgy is often used to fabricate articles that are to be used in highly demanding applications. In such articles, it is important to achieve chemical and physical homogeneity. Articles made by casting from a melt often contain significant chemical inhomogeneities as a result of the solidification processes. They also contain physical homogeneities such as internal voids and surface cracks. The chemical and physical inhomogeneities lead to reduced physical properties or premature failure in service. Powder metallurgical production can avoid these inhomogeneities because the article is fabricated from substantially chemically homogeneous powder particles that are processed to avoid physical inhomogeneities.

To make an article by a powder metallurgy approach, powder particles are first prepared. Several powder-preparation approaches are known. In inert gas atomization, for example, the material to be made into powder is melted, and a jet of an inert gas is directed against a stream of the molten metal. Droplets of the molten metal are produced, and these droplets solidify to form the powder particles. The powder particles are graded to separate the size fractions of interest. Other atomization methods include water, oil, vacuum atomization, and centrifugal atomization, including processes such as rotating electrode, spinning cup, and rotating disk methods. However produced, the powder particles are thereafter processed to form the article. Typically, the powder particles are consolidated together by a technique such as canned extrusion, cold or hot pressing, or hot isostatic pressing. The consolidated powder is final processed by forging, machining, heat treating, and/or other appropriate operations.

The powder metallurgical approach has significant limitations as to the compositions of the powder that may be produced, and thence on the compositions of the final articles. Some alloying elements of interest cannot be practically incorporated into the melt from which the powder is made, or may be incorporated but not in the desired form or spatial distribution, due to a variety of thermodynamic and/or kinetic reasons. As a result, the compositions of powder particles that are available for processing are limited.

There is a need for an improved approach to the fabrication of articles that have the beneficial features achieved through powder metallurgical techniques, but are not limited in their compositions or physical structures in the manner of current powders. The present invention fulfills this need, and further provides related advantages.

SUMMARY OF THE INVENTION

The present invention provides an approach for incorporating alloying elements into metal powder particles, in types, amounts, and/or distributions that would not be possible using conventional metal powder production techniques. The present approach may be used with melt-produced powders or meltless powders, and may be incorporated into the powder production process to achieve good cleanliness, a preferred spatial distribution of alloying elements in the particles and in the final product, and good process economics.

A method for making an article comprises the steps of furnishing a plurality of powder particle substrates made of a substrate metal, and providing a nonmetallic precursor of a metallic coating material. The metallic coating material comprises an alloying element that is thermophysically melt incompatible with the substrate metal. The method further includes contacting the powder particle substrates with the nonmetallic precursor, and chemically reducing the nonmetallic precursor to form coated powder particles comprising the powder particle substrates having a surface-enriched layer of the metallic coating material thereon without melting the powder particle substrates. Preferably, the coated powder particles are processed to form the article without melting the powder particle substrates.

The powder particle substrates may be made by any operable powder production techniques. Examples include melt-production techniques such as inert gas atomization of a melt and other atomization processes, and meltless techniques.

The powder particles may be of any operable composition. Examples include powder particle substrates made of a superalloy metal, a nickel-base metal, a cobalt-base metal, an iron-base metal, a nickel-iron base metal, a nickel-iron-cobalt base metal, a titanium-base metal, an aluminum-base metal, or a magnesium-base metal.

The nonmetallic precursor may be a precursor of any operable metallic coating material, with examples including platinum, hafnium, calcium, magnesium, cerium, yttrium, lanthanum, erbium, neodymium, and europium. The nonmetallic precursor may be in solid, liquid, or gaseous form. In a preferred approach, the nonmetallic precursor is a gaseous organometallic compound. The contacting of the precursor compound to the powder particles may be accomplished in any operable manner, with a fluidized bed being preferred. The powder particles may have some of the metallic coating material present prior to coating, and the coating process adds more of the metallic coating material.

The processing includes any steps needed to process the coated powder particles into the article. Such steps include, for example, consolidating the coated powder particles to make an article, and then forging, heat treating, machining, and/or coating the article. The processing may include fully interdiffusing the surface-enriched layer with its respective powder particle substrate so that substantially no surface-enriched layer remains at the surface of the respective powder particle substrates. Alternatively, at least a portion of the surface-enriched layer at the surface of the respective powder particle substrates may be maintained without fully interdiffusing the surface-enriched layer with the respective powder particle substrate, so that an elevated concentration of the metallic coating material remains at the surface of the powder particle substrate.

A method of particular interest for making an article includes furnishing a plurality of powder particle substrates made of a superalloy substrate metal by gas atomization of a melt, and providing a gaseous nonmetallic precursor of a metallic coating material. The metallic coating material comprises an alloying element that is thermophysically melt incompatible with the superalloy substrate metal. The method includes contacting the powder particle substrates with the nonmetallic precursor in a fluidized bed, and chemically reducing the nonmetallic precursor to form coated powder particles comprising the powder particle substrates having a surface-enriched layer of the metallic coating material thereon, without melting the powder particle substrates. The chemical reduction may be accomplished by using a reducing gas as the fluidizing gas of the fluidized bed. The method further includes processing the coated powder particles to form the article without melting the powder particle substrates, wherein the step of processing includes the steps of consolidating the coated powder particles, and heat treating the article. Other operable features discussed herein may be used with this approach.

The thermophysical-melt-incompatible alloying element is an element that may not be incorporated into the powder particle in its desired form and/or distribution during melting because of some thermophysical limitation on the co-melting of the substrate metal and the alloying element. The present approach introduces the thermophysically melt incompatible alloying element to the powder particle by an alternative path in the form of a nonmetallic precursor that is subsequently chemically reduced to deposit the alloying element onto the surface of the powder particle. That is, whether the powder particle was melted or not during its initial preparation, it is not melted as the alloying element is being introduced so that the potential thermophysical melt incompatibility is avoided. The alloying element may be diffused through the powder particle substrate to achieve a homogeneous composition, or diffused little or not at all in order to leave a preferential concentration of the alloying element at the surface of the powder particle. In the latter case, the alloying element remains at the former powder-particle boundaries after processing, to provide surface oxidation resistance, to provide grain boundary growth inhibition, to produce a particular precipitate at the boundary, or to provide some other desired function.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIG. 4 is a schematic representation of a second embodiment of an apparatus for forming coated powder particles.

DETAILED DESCRIPTION OF THE INVENTION

Figure 1:
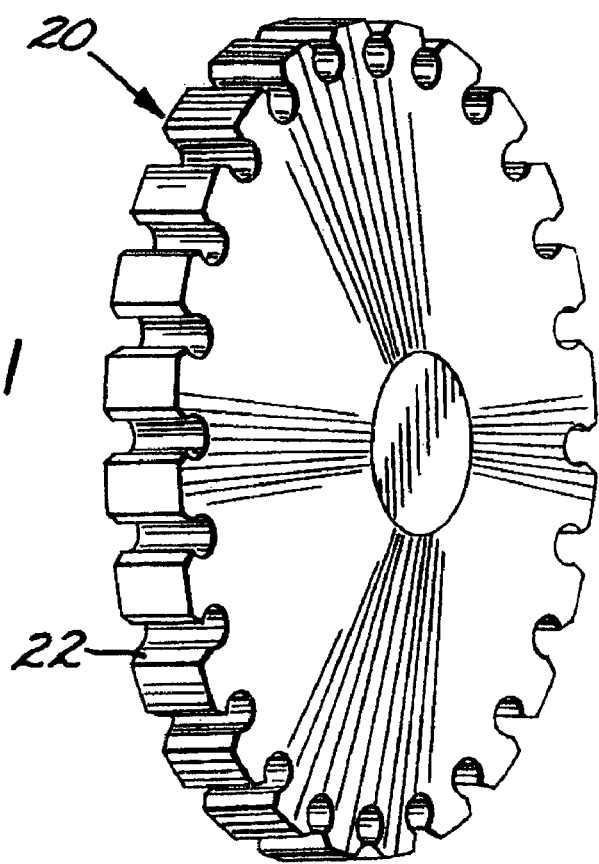
FIG. 1 is a perspective view of a metallic article prepared according to the present approach.

The present approach may be used to make a wide variety of metallic articles 20, such as a component of a gas turbine engine as depicted in FIG. 1. The illustrated consolidated metallic article 20 is a turbine disk, with slots 22 in the rim that are subsequently machined after the consolidation. A respective turbine blade (not shown) is received in each slot 22. Some other examples include other gas turbine components such as compressor disks, compressor blades and vanes, turbine vanes and blades, bearings, blisks, cases, shafts, automobile parts, biomedical articles, structural members such as airframe parts, and rocket engine and other propulsion systems components. There is no known limitation on the types of articles that may be made by this approach.

Figure 2:
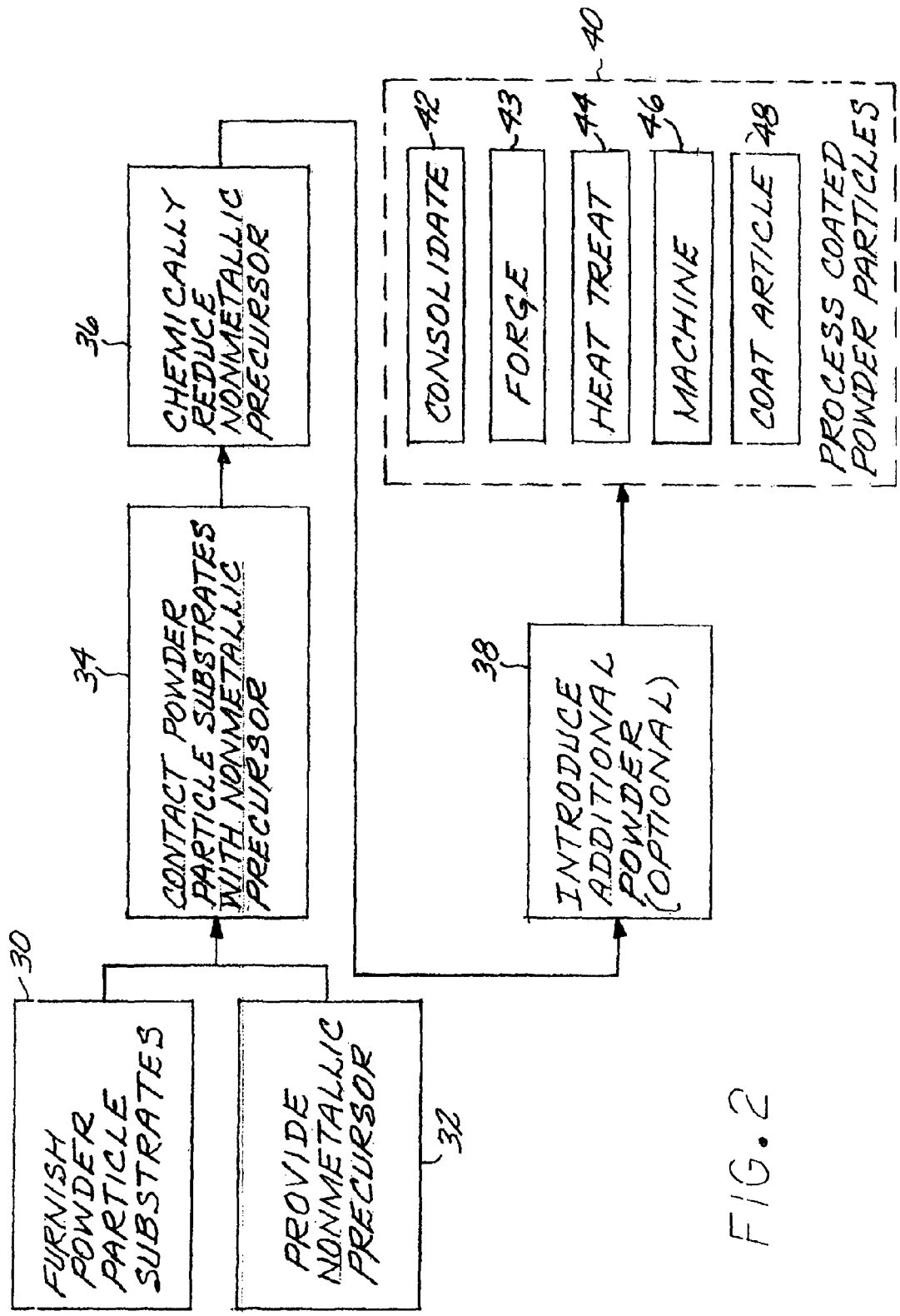
FIG. 2 is a block flow diagram of an approach for practicing the invention.
Figure 3:
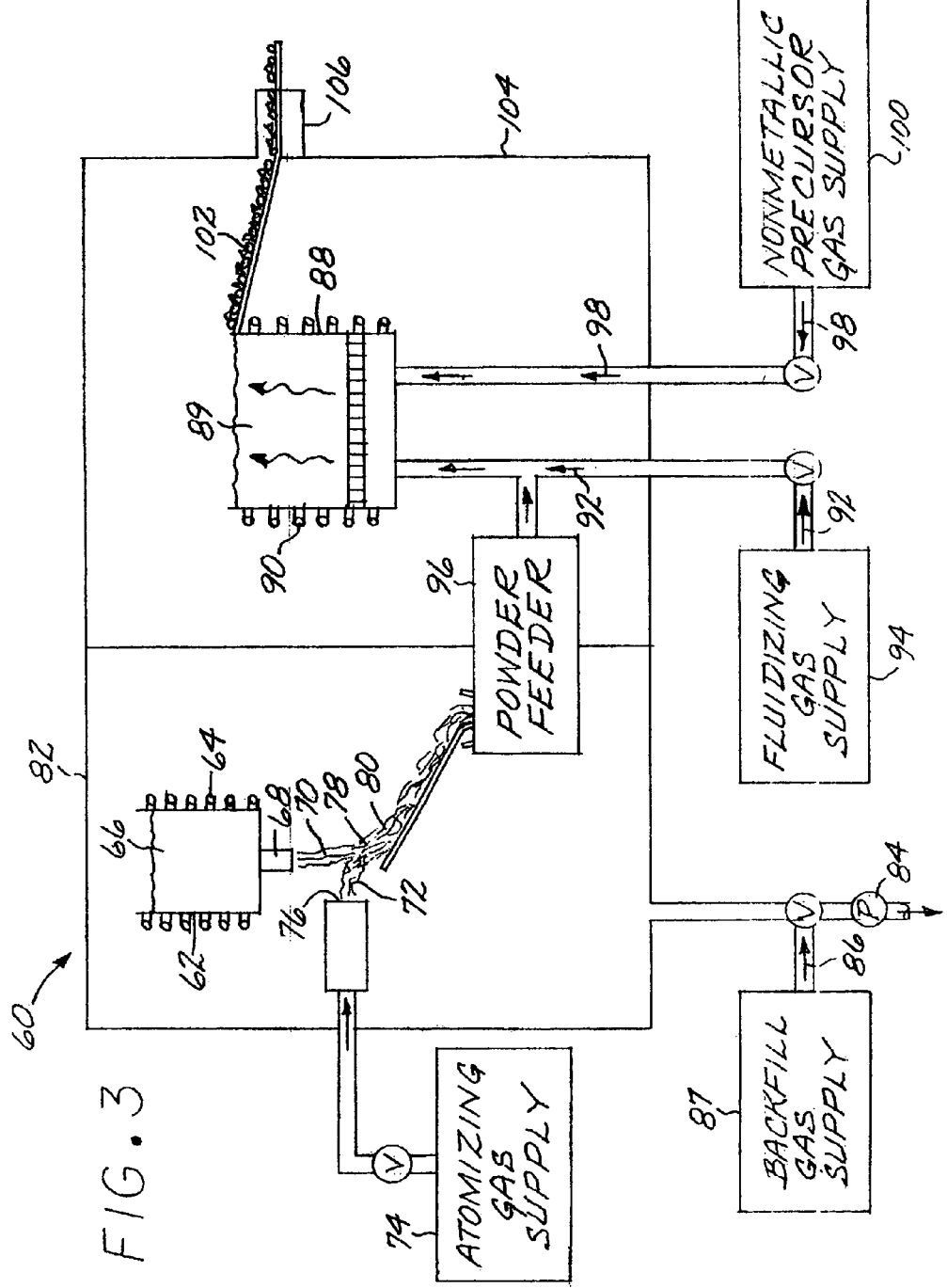
FIG. 3 is a schematic representation of a first embodiment of an apparatus for forming coated powder particles.

FIG. 2 depicts a method for making such an article 20, and FIGS. 3 and 4 schematically represent apparatus 60 for forming coated powder particles. In the method of FIG. 2, a plurality of powder particle substrates made of a substrate metal is furnished, step 30. The powder particle substrates may be of any operable metallic composition, either a pure metal or an alloy. Some examples include a nickel-base metal, a cobalt-base metal, an iron-base metal, a nickel-iron base metal, a nickel-iron-cobalt base metal, a titanium-base metal, an aluminum-base metal, and a magnesium-base metal. As used herein, an "X-base" metallic composition is defined as having more of metallic element(s) X than any other single element, and in many cases has more than 50 percent by weight of element(s) "X". A preferred metallic composition of the powder particle substrates is a superalloy, such as a nickel-base superalloy, which will serve as the basis for the discussion. As used herein, a "superalloy" is a nickel-base, cobalt-base, iron-base, iron-nickel-base, or iron-nickel-cobalt-base alloy having at least two phases, including a continuous matrix phase with a face-centered-cubic crystal structure that is strengthened by both solid solution strengthening and the presence of one or more additional discrete phases that are distributed throughout the matrix phase, where the discrete phases have a different composition than the matrix phase. The discrete phase or phases may be produced at any point of the processing. The strengthening discrete phase or phases present in the superalloy in its fully heat treated, service condition-form, is at least about 5 percent by volume in the case of iron-base alloys, at least about 10 percent by volume in the case of nickel-base, iron-nickel-base, and iron-nickel-cobalt-base alloys, and at least about 1 percent by volume in the case of cobalt-base alloys.

The powder particle substrates may be furnished in any operable manner. The powder particle substrates may be made by a melt-based approach. They may instead be made by a meltless approach such as that described, for example, in U.S. Pat. No. 6,737,017, whose disclosure is incorporated by reference.

FIG. 3 depicts the apparatus 60 for furnishing the powder particle substrates by a melt-based approach, in this case a gas atomization approach. A crucible 62 heated by an appropriate heater such as an induction heating coil 64 contains a melt 66 of the substrate metal. The crucible 62 has a spout 68 that allows a stream 70 of the substrate metal to flow from the crucible 62. A jet 72 of an inert atomizing gas flows supplied from an atomizing gas supply 74 flows from a nozzle 76 to impinge upon the stream 70. The stream 70 is broken up by the jet 72 of the atomizing gas to form liquid droplets 78 of the substrate metal. The liquid droplets 78 cool and solidify, forming solid powder particle substrates 80. The solid powder particle substrates 80 are collected and graded by size, and the solid powder particle substrates 80 of the correct size range are supplied to the next stage of the process, to be described subsequently. A chamber 82 surrounds the gas atomization components, and the chamber may be controllably evacuated by a pump 84 or backfilled with a backfill inert gas 86 from a backfill gas supply 87.

Returning to FIG. 2, the method further includes providing a nonmetallic precursor of a metallic coating material, step 32. The metallic coating material comprises an alloying element that is thermophysically melt incompatible with the substrate metal, "Thermophysical melt incompatibility" and related terms refer to the basic concept that any identified thermophysical property of an alloying element is sufficiently different from that of the base metal to cause detrimental effects in the melted final product. These detrimental effects include phenomena such as chemical inhomogeneity (detrimental micro-segregation, macro-segregation such as flecks, white spots, or freckles, and gross segregation from vaporization or immiscibility), slag formation in the molten bath, reactive elements that can degrade refractory liners, inclusions of the alloying elements such as high-density inclusions, and the like. Thermophysical properties are intrinsic to the elements, and combinations of the elements, which form alloys, and are typically, envisioned using equilibrium phase diagrams, vapor pressure versus temperature curves, curves of densities as a function of crystal structure and temperature, and similar approaches. Although alloy systems may only approach predicted equilibrium, these envisioning data provide information sufficient to recognize and predict the cause of the detrimental effects as thermophysical melt incompatibilities. However, the ability to recognize and predict these detrimental effects as a result of the thermophysical melt incompatibility does not eliminate them. The present approach provides a technique to minimize and desirably avoid the detrimental effects by the elimination of melting in the preparation and processing of the alloy.

Thus, "thermophysical melt incompatible" and related terms mean that the alloying element or elements in the alloy to be produced do not form an alloy with the base metal and do not have the alloying element or elements located at the desired locations and in the desired chemical form in a production melting operation in a stable, controllable fashion, or are otherwise thermophysically incompatible with a melt of the desired composition in a production setting. In some instances, a thermophysically melt incompatible alloying element cannot be readily incorporated into the alloy at any compositional level. For example, some elements do not behave in a thermophysically melt incompatible manner when introduced at low levels, and homogeneous alloys of such low levels of alloying additions may be prepared. However, if there is an attempt to introduce greater levels of such elements, they tend to segregate strongly in the melt and thus behave in a thermophysically melt incompatible manner so that homogeneous alloys can only be prepared with great difficulty or not at all. The precise composition range of the thermophysical melt incompatibility may depend upon the processing route (e.g., cast, cast-and-wrought, or powder) of the alloy. In other instances the alloying element can be incorporated at low levels but not at higher levels. In other cases, the thermophysically melt incompatible alloying element can be incorporated, but not in the desired phases and locations within the powder particle or within the microstructure of the consolidated article.

The thermophysical melt incompatibility of the alloying element with nickel-base superalloys may be any of several types, and some examples follow.

One such thermophysical melt incompatibility is in the vapor pressures, as where the alloying element has an evaporation rate of greater than about 10 times that of the base metal at a melt temperature, which is preferably a temperature just above the liquidus temperature of the alloy. Examples of such alloying elements for nickel-base alloys include bismuth, cadmium, calcium, and magnesium. Where the vapor pressure of the alloying element is too high, it will preferentially evaporate, as indicated by the evaporation rate values, when ceo-melted with nickel, cobalt, iron, iron-nickel, or iron-nickel-cobalt base metals under a vacuum in conventional melting practice. An alloy will be formed, but it is not stable during melting and continuously loses the alloying element so that the percentage of the alloying element in the final alloy is difficult to control. In the present approach, because there is no vacuum melting during the steps of contacting and chemically reducing, the high melt vapor pressure of the alloying element is not a concern.

Another such thermophysical melt incompatibility occurs when the melting point of the alloying element is too high or too low to be compatible with that of the substrate metal. For nickel-base, cobalt-base, or iron-base substrates, such thermophysical melt incompatibility occurs where the alloying element has a melting point different from (either greater than or less than) that of the substrate metal of more than about 400° C. (720° F.). Examples of such alloying elements for nickel-base substrate alloys include cadmium, gallium, hafnium, indium, lanthanum, magnesium, niobium, rhenium, and tantalum. Some of these elements may be furnished in master alloys whose melting points are closer to that of the base metal such as nickel, but the master alloys are often expensive. If the melting point of the alloying element is too high, it is difficult to melt and homogenize the alloying element into the melt in conventional vacuum melting practice. The segregation of such alloying elements may result in the formation of high-density inclusions containing that element. If the melting point of the alloying element is too low, it will likely have an excessively high vapor pressure at the temperature required to melt the base metal. In the present approach, because there is no melting during the steps of contacting and chemically reducing, the overly high or low melting points are not a concern.

Another such thermophysical melt incompatibility occurs when the density of the alloying element is too high or too low to be compatible with that of the substrate metal in the molten state. For nickel-base, cobalt-base, or iron-base substrates, such thermophysical melt incompatibility occurs where the alloying element has a density difference with the substrate metal of greater than about 0.5 gram per cubic centimeter. Examples of such alloying elements for nickel-base substrate alloys include tungsten, molybdenum, niobium, and tantalum. In conventional melting practice, the overly high or low density leads to gravity-driven segregation of the alloying element. In the present approach, because there is no melting during the steps of contacting and chemically reducing, there can be no gravity-driven segregation.

Another such thermophysical melt incompatibility occurs when the alloying element, or a chemical compound formed between the alloying element and the substrate metal, chemically reacts with the substrate metal in the liquid phase. Examples of such alloying elements for nickel-base substrate alloys include erbium, europium, gadolinium, lanthanum, nitrogen, neodymium, and yttrium. In conventional melting practice, the chemical reactivity of the alloying element with the base metal leads to the formation of intermetallic compounds including the base metal and the alloying element, and/or other deleterious phases in the melt, which are retained after the melt is solidified. These phases, partially because of their agglomerated sizes, often have adverse effects on the properties of the final alloy. In the present approach, because the metals are not heated to the point where these reactions occur during the steps of contacting and chemically reducing, the compounds are not formed or are not formed in deleterious phase distributions.

Another such thermophysical melt incompatibility is the result of a miscibility gap between the alloying element and the substrate metal in the liquid phase. Examples of such alloying elements for nickel-base alloys include silver, barium, lithium, lead, and thallium. In conventional melting practice, a miscibility gap leads to a segregation of the melt into the compositions defined by the miscibility gap. The result is inhomogeneities in the melt, which are retained in the final solidified article. The inhomogeneities lead to variations in properties throughout the final article. In the present approach, because the elements are not melted during the steps of contacting and chemically reducing, the miscibility gap is not a concern.

Another such thermophysical melt incompatibility occurs due to elemental segregation during solidification, which causes an unacceptable phase distribution of the alloying element in the solidified ingot. The degree of segregation may be reduced in melted-and-cast product by lowering the melting power, reducing the ingot diameter, reducing superheat, using long post-casting homogenization heat treatments, and the like, but these prior approaches increase cost and limit the type of product that may be produced. In the present process, this type of segregation is avoided because the substrate is not melted and solidified, if at all, after the thermophysical-melt-incompatible element is added. Examples of such segregating alloying elements for nickel-base alloys include arsenic, gold, beryllium, calcium, cadmium, chromium, gadolinium, germanium, hafnium, indium, scandium, silicon, tantalum, zirconium, and zinc. The segregation of elements in conventional melting-and-casting practice results in adverse effects on mechanical properties as well as physical properties such as corrosion, oxidation, and sulfidization resistance.

Another thermophysical incompatibility is not strictly related to the nature of the base metal, but instead to the crucibles or environment in which the base metal is melted. Substrate metals may require the use of a particular crucible material or melting atmosphere, and some potential alloying elements may chemically react with those crucible materials or melting atmospheres, and therefore not be candidates as alloying elements for that particular base metal. Examples of such incompatible alloying elements for nickel-base alloys include hafnium, calcium, lanthanum, yttrium, and cerium.

Another thermophysical melt incompatibility occurs when the alloying element may be incorporated, but not in the desired form (i.e., phase type) or at the desired location within the powder particle or within the microstructure of the consolidated article. Examples of such thermophysical-melt-incompatible alloying elements for nickel-base alloys include boron, aluminum, carbon, and nitrogen.

These and other types of thermophysical melt incompatibilities lead to difficulty or impossibility in forming acceptable alloys of these elements in conventional production vacuum melting and gas atomization. Their adverse effects are avoided in the present melt-less approach.

The powder particle substrates 80 are contacted with the nonmetallic precursor, step 34. "Nonmetallic precursors" are chemically reducible nonmetallic compounds of the metals that eventually constitute the metallic coating material. The metals may be pure metals or alloys. Any operable gas, liquid, or solid nonmetallic precursor compounds may be used, as appropriate for the contacting and reduction approach. In a preferred embodiment of the approach to be described subsequently, the nonmetallic precursors are in gaseous form such as organometallic compounds. Examples of operable organometallic compounds for depositing some of the thermophysically melt incompatible elements discussed above include $Pt[C_2H_5O_2]_2$ for platinum, or chrome carbonyl for chromium. The coating step 34 may be accomplished with a single operation that deposits a single coating layer, or in two or more operations that deposit two or more coating layers.

Figure 5:
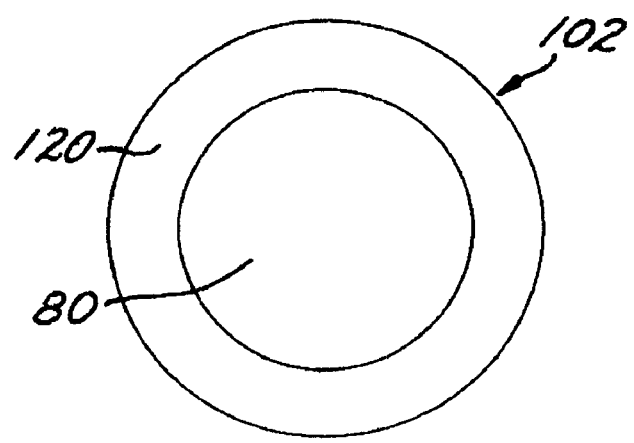
FIG. 5 is a schematic cross sectional view of a coated powder particle after chemical reduction.

The nonmetallic precursor is chemically reduced to form coated powder particles comprising the powder particle substrates 80 having a surface-enriched layer 120 of the metallic coating material thereon, as depicted in FIG. 5. (There may be a single surface-enriched layer 120 as illustrated, or multiple surface-enriched layers 120. The chemical reduction 36 is performed without melting the powder particle substrates 80.

The chemical reduction 36 may be performed at any operable time or range of times during the processing, for example after the contacting 34, or substantially simultaneously with the contacting 34, depending upon the apparatus used.

In the apparatus 60 of FIG. 3, the contacting 34 and reduction 36 are performed in a fluidized bed 88 holding a fluidizing medium 89 and heated to an appropriate temperature by a heater such as an induction heating coil 90. A fluidizing gas 92 is supplied from a fluidizing gas supply 94. The fluidizing gas 92 is preferably a reducing gas such as hydrogen gas, or a mixture of a reducing gas with an inert gas such as argon. The solid powder particle substrates 80 from the powder furnishing step 30 are input to a powder feeder 96, which supplies the powder particle substrates 80 to be mixed into the fluidizing gas 92. The mixture of solid powder particle substrates 80 and fluidizing gas 92 is introduced into the bottom of the fluidized bed 88. The nonmetallic precursor gas 98 from a nonmetallic precursor gas supply 100 is also supplied to the bottom of the fluidized bed 88. Within the fluidized bed 88, the solid powder particle substrates 80 and the fluidizing gas 92 mix with the nonmetallic precursor gas 98, resulting in both the contacting 34 of the nonmetallic precursor gas 98 to the powder particle substrates 80, and the chemical reduction of the nonmetallic precursor gas 98 to form the surface-enriched layer 120 of the metallic coating material on the powder particle substrates 80. The result is coated powder particles 102 that flow from the fluidized bed 88 and out of an optional environmental chamber 104 that encloses the fluidized bed 88, through an air lock 106.

FIG. 4 depicts another embodiment of the apparatus based on the use of the fluidized bed for accomplishing the contacting step 34. The embodiment of FIG. 4 has some similarities to the embodiment of FIG. 3. Common features are assigned the same reference numerals, and the prior description is incorporated as to those common features. The embodiment of FIG. 4 differs in that the solid powder particle substrates 80 are fed directly into the fluidized bed 88, rather than introduced into the flow of the fluidizing gas 92 before it is injected into the fluidized bed 88. Similarly, a solid nonmetallic precursor 110, typically in the form of particles of the nonmetallic precursor 110, is fed directly into the fluidized bed 88 from a solid precursor supply 112, rather than introduced as a gas into the bottom of the fluidized bed 88 as in the embodiment of FIG. 3. The solid powder particle substrates 80 and the particles of the solid nonmetallic precursor 110 contact each other in the reducing environment of the fluidized bed 88 produced by using a reducing fluidizing gas 92. Whatever the apparatus 60, the addition of the thermophysical melt incompatible element to the powder surfaces may be performed during or in line with the powder manufacturing process, but also may be conducted in a separate environment.

In yet another approach, the solid powder particle substrate 80 may be coated in step 34 by electrodeposition. Electrodeposition approaches used in other contexts may be adapted for use in the present approach. Such electrodeposition approaches are described, for example, in U.S. Pat. Nos. 5,911,865 and 6,010,610, whose disclosures are incorporated by reference.

The coated powder particles 102 are typically thereafter further processed to form the article 20, step 40. The processing step 40 is performed without melting the powder particle substrates 80. The exact process steps in the processing will depend upon the processing chosen, and FIG. 2 illustrates some processing steps 40 of most interest. These steps may be performed in any operable sequence. Prior to the processing step 40, additional powder which has a different particle size, different alloying elements added to the particle surface, or which has no thermophysical melt incompatible alloying elements may be added, step 38.

The coated powder particles 102 are typically consolidated together, step 42. Any operable consolidation approach may be used, such as canned extrusion, cold or hot pressing, or hot isostatic pressing. The consolidation forms the bulk article 20 from the mass of powders.

The coated powder particles prior to consolidation, or the article 20 after consolidation, may be heat treated, step 44. The heat treating 44 may be used to produce specific phases, such as in the precipitation of gamma prime phase in nickel-base superalloys. Such heat-treating sequences are known in the art for each alloy type. The heat treating 44 may also be used simply to affect a partial or a full interdiffusion of the powder particle substrates 80 and the surface-enriched layer 120. In the case where there is no interdiffusion or a partial interdiffusion, the surface-enriched layer 120 is maintained completely or partially present as a discernible layer. In the case where there is a full interdiffusion or substantially a full interdiffusion, substantially no discernible surface-enriched layer remains at the surface of the respective powder particle substrates 80. Each of these interdiffusion cases has applications of interest. Maintaining at least a portion of the surface-enriched layer 120 at the surface of the respective powder particle substrates 80 results in a layer of different composition at the surface. The surface-enriched layer 120 may inhibit grain growth or provide other localized grain-boundary properties of interest such as resistance to preferential oxidation and/or corrosion.

The article 20 may also be forged, step 43, machined, step 46, or coated, step 48, or otherwise further processed as needed to complete the article.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method for making an article, comprising the steps of:
   furnishing a plurality of powder particle substrates made of a substrate metal; providing a nonmetallic precursor of a metallic coating material, wherein the metallic coating material comprises an alloying element that is thermophysically melt incompatible with the substrate metal;
   contacting the powder particle substrates with the nonmetallic precursor;
   chemically reducing the nonmetallic precursor to form coated powder particles comprising the powder particle substrates having a surface-enriched layer of the metallic coating material thereon, wherein the step of chemically reducing is performed without melting the powder particle substrates; and
   processing the coated powder particles to form the article, wherein the step of processing is performed without melting the powder particle substrates.

2. The method of claim 1, wherein the step of furnishing includes the step of
   furnishing superalloy powder particle substrates.

3. The method of claim 1, wherein the step of furnishing includes the step of
   furnishing powder particle substrates selected from the group consisting of a superalloy metal, a nickel-base metal, a cobalt-base metal, an iron-base metal, a nickel-iron base metal, a nickel-iron-cobalt base metal, a titanium-base metal, an aluminum-base metal, and a magnesium-base metal.

4. The method of claim 1, wherein the step of furnishing includes the step of
   producing the powder particle substrates by atomization of a melt.

5. The method of claim 1, wherein the step of furnishing includes the step of
   producing the powder particle substrates by a meltless process.

6. The method of claim 1, wherein the step of providing includes the step of
   providing the nonmetallic precursor of platinum, hafnium, calcium, magnesium, cerium, yttrium, lanthanum, erbium, neodymium, or europium.

7. The method of claim 1, wherein the step of providing the nonmetallic precursor includes the step of
   providing a gaseous nonmetallic precursor comprising an organometallic compound.

8. The method of claim 1, wherein the step of contacting includes the step of
   contacting the powder particle substrates with the nonmetallic precursor in a fluidized bed.

9. The method of claim 1, wherein the step of processing includes the step of
   consolidating the coated powder particles.

10. The method of claim 1, wherein the step of processing includes the step of
    heat treating the article.

11. The method of claim 1, wherein the step of processing includes the step of
    fully interdiffusing the surface-enriched layer with its respective powder particle substrate so that substantially no surface-enriched layer remains at the surface of the respective powder particle substrates.

12. The method of claim 1, wherein the step of processing includes the step of
    maintaining at least a portion of the surface-enriched layer at the surface of the respective powder particle substrates without fully interdiffusing the surface-enriched layer with the respective powder particle substrate.

13. The method of claim 1, wherein the step of furnishing includes the step of
    furnishing powder particle substrates made of a titanium-base metal.

14. A method for making an article, comprising the steps of:
    furnishing a plurality of powder particle substrates made of a superalloy substrate metal;
    providing a gaseous nonmetallic precursor of a metallic coating material, wherein the metallic coating material comprises an alloying element that is thermophysically melt incompatible with the superalloy substrate metal;
    contacting the powder particle substrates with the nonmetallic precursor;
    chemically reducing the nonmetallic precursor to form coated powder particles comprising the powder particle substrates having a surface-enriched layer of the metallic coating material thereon, wherein the step of chemically reducing is performed without melting the powder particle substrates; and
    processing the coated powder particles to form the article without melting the powder particle substrates, wherein the step of processing includes the step of consolidating the coated powder particles, wherein the step of consolidating is performed without melting the powder particle substrates, and heat treating the article.

15. The method of claim 14, wherein the step of furnishing includes the step of producing the powder particle substrates by atomization of a melt.

16. The method of claim 14, wherein the step of furnishing includes the step of producing the powder particle substrates by a meltless process.

17. The method of claim 14, wherein the step of contacting includes the step of contacting the powder particle substrates with the nonmetallic precursor in a fluidized bed.

18. The method of claim 14, wherein the step of processing includes the step of fully interdiffusing the surface-enriched layer with its respective powder particle substrate so that substantially no surface-enriched layer remains at the surface of the respective powder particle substrates.

19. The method of claim 14, wherein the step of processing includes the step of maintaining at least a portion of the surface-enriched layer at the surface of the respective powder particle substrates without fully interdiffusing the surface-enriched layer with the respective powder particle substrate.

20. A method for making an article, comprising the steps of:

furnishing a plurality of powder particle substrates made of a superalloy substrate metal by atomization of a melt;

providing a gaseous nonmetallic precursor of a metallic coating material, wherein the metallic coating material comprises an alloying element that is thermophysically melt incompatible with the superalloy substrate metal and is selected from the group consisting of platinum, hafnium, calcium, magnesium, cerium, yttrium, lanthanum, erbium, neodymium, and europium;

contacting the powder particle substrates with the nonmetallic precursor in a fluidized bed;

chemically reducing the nonmetallic precursor to form coated powder particles comprising the powder particle substrates having a surface-enriched layer of the metallic coating material thereon, wherein the step of chemically reducing is performed without melting the powder particle substrates; and processing the coated powder particles to form the article without melting the powder particle substrates, wherein the step of processing includes the steps of consolidating the coated powder particles, wherein the step of consolidating is performed without melting the powder particle substrates, and heat treating the article.

21. The method of claim 20, wherein the step of processing includes the step of fully interdiffusing the surface-enriched layer with its respective powder particle substrate so that substantially no surface-enriched layer remains at the surface of the respective powder particle substrates.

22. The method of claim 20, wherein the step of processing includes the step of maintaining at least a portion of the surface-enriched layer at the surface of the respective powder particle substrates without fully interdiffusing the surface-enriched layer with the respective powder particle substrate.

* * * * *